United States Patent [19]

Trilling

[11] 4,088,962
[45] May 9, 1978

[54] SELF BIASING DIFFERENTIAL AMPLIFIER

[76] Inventor: Ted R. Trilling, Berkshire Rd., R.D. 4, Doylestown, Pa. 18901

[21] Appl. No.: 785,005

[22] Filed: Apr. 6, 1977

[51] Int. Cl.$^2$ .............................................. H03F 3/45
[52] U.S. Cl. ..................................... 330/261; 330/59; 330/69; 330/85; 330/103; 330/258; 330/260
[58] Field of Search .................. 330/59, 69, 85, 103, 330/258, 260, 261

[56] References Cited

U.S. PATENT DOCUMENTS

| | | | |
|---|---|---|---|
| 3,275,945 | 9/1966 | Walker et al. ..................... | 330/30 D |
| 3,582,802 | 6/1971 | Weekes ............................. | 330/26 X |
| 3,845,404 | 10/1974 | Trilling ........................... | 330/30 D X |
| 3,955,149 | 5/1976 | Trilling ............................ | 330/30 D |

Primary Examiner—Lawrence J. Dahl
Attorney, Agent, or Firm—R. S. Sciascia; Henry Hansen; William J. Iseman

[57] ABSTRACT

A self biasing low input impedance differential amplifier for current mode applications requiring wide bandwidth with response down to DC. A shunt-shunt differential mode feedback system in combination with a series-shunt common mode feedback system is connected between an input amplifier stage and an output amplifier stage. An additional shunt-series common mode feedback signal is applied to the input stage to short out the common mode component of the amplifier input signal and minimize input signal drift. High open loop gain in the differential feedback loop provides low impedance amplifier inputs.

11 Claims, 4 Drawing Figures

SELF BIASING DIFFERENTIAL AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to differential amplifiers and in particular to a differential amplifier having low impedance self biasing inputs.

Differential amplifiers are highly useful because of their ability to handle a differential mode signal in the presence of the commond mode signal without adverse effects to the differential mode signal. It is often desirable to produce low impedance and ultra low impedance (less than one ohm) input differential amplifiers for current mode applications requiring wide bandwidths with frequency response down to DC. For those amplifiers having low impedance transducer devices coupled to inputs, it is desirable to provide differential isolation for such transducers allowing operation of the devices fully floating from ground and still operating near ground potential. Current mode instrumentation amplifiers also make efficient use of low input impedance amplifiers from maxium coupling efficiency between input device and amplifier.

One example of prior art component combinations for making current mode amplifiers consists of single ended output operational amplifiers with feedback resistors operating in the shunt input mode to produce a low input impedance or the "current mirror" type of current mode amplifiers such as exemplified by the Motorola 3401P and the National Semi-conductor LM2900 single ended amplifiers. Such structure does not effectively produce ultra low input impedance amplifiers on the order of less than one ohm for efficient current mode applications requiring wide bandwidths and with response down to DC. Various other methods and structure for controlling input and output impedances and differential amplifier systems are disclosed in three of the inventor's previous U.S. Pat. Nos. 3,638,132, 3,845,404, and 3,955,149 which teach the use of active feedback in both the common and differential modes to improve differential amplifier performance involving high input impedances for voltage mode differential amplifiers, and current mode and differential mode amplifiers featuring both hardwire and optical coupling in the feedback systems.

SUMMARY OF THE INVENTION

Accordingly, it is an object of the present invention to provide a self biasing differential amplifier which provides differential isolation for transducer input devices allowing operation of the transducer fully floating from ground while still operating near ground potential. Another object of this invention is to provide a low input impedance differential amplifier. Yet another object of this invention is to provide an efficient current mode instrumentation amplifier. Still another object of the invention is to produce a low impedance and ultra low impedance differential amplifier for current mode applications requiring wide bandwidths with response down to DC.

Briefly, these and other objects are accomplished by a self biasing low input impedance differential amplifier having a shunt-shunt differential mode feedback system connected in combination with a series-shunt common mode feedback system between an input amplifier stage and an output amplifier stage. An additional shunt-series common mode feedback signal is applied to the input stage from the output stage to short the common mode component of the differential amplifier input signal and to minimize input signal drift. Low input impedance amplifier inputs are obtained by increasing the open loop gain in the differential feedback loop between the input and output stages. The feedback system is disclosed in alternate embodiments having both hardwire connections and optical coupling for increasing isolation between amplifier stages.

For a better understanding of these and other aspects of the invention, reference may be made to the following detail description taken in conjunction with the accompanying drawings.

DESCRIPTION OF THE PREFERRED EMBODIMENT

Figure 1:
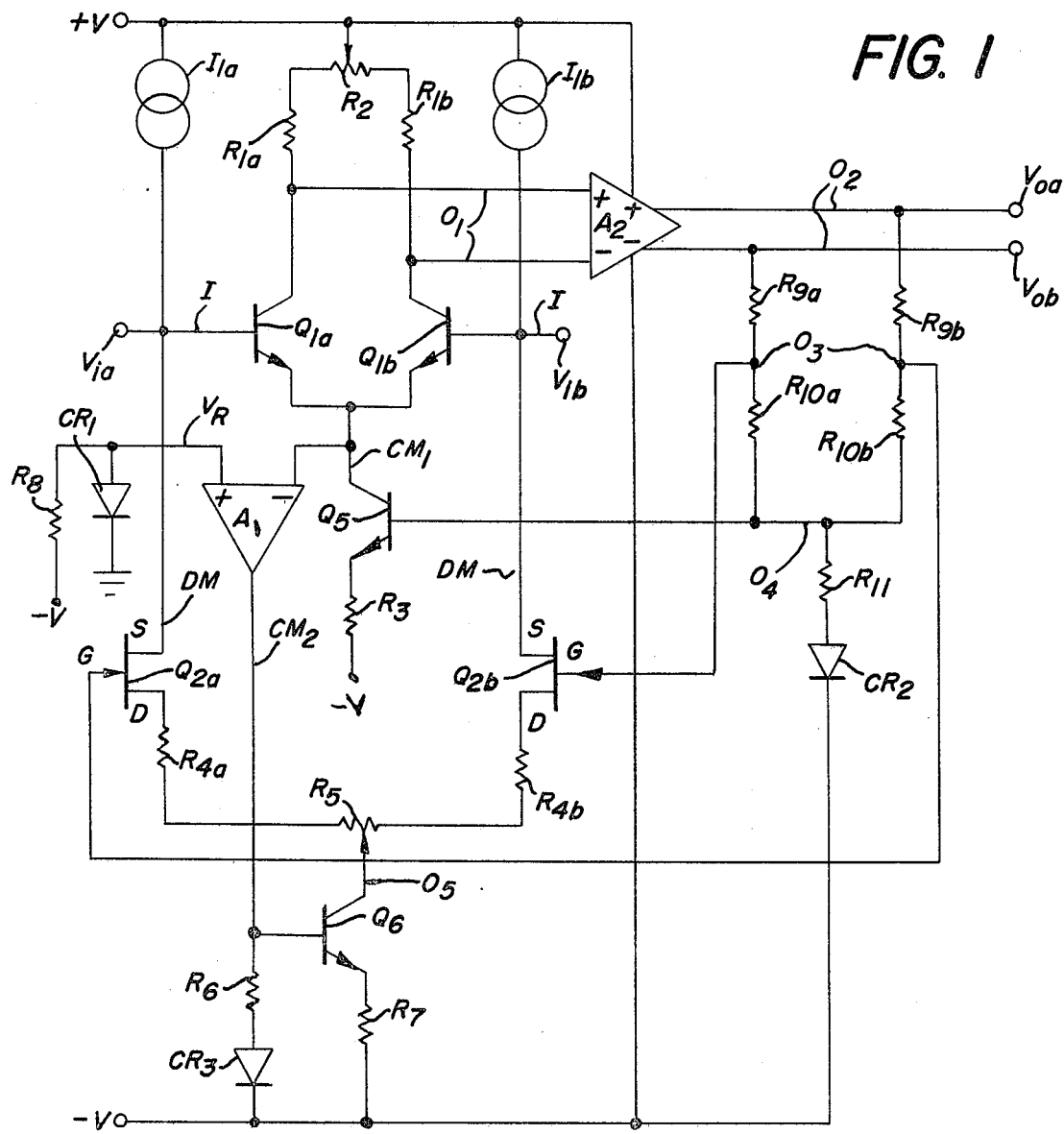
FIG. 1 is a simplified circuit diagram of a differential amplifier made according to the invention.

Referring now to FIG. 1, there is illustrated a simplified circuit diagram of a differential amplifier made according to the present invention and which incorporates a shunt-shunt differential mode feedback system in combination with a series-shunt common mode feedback system. An input transistor pair $Q_{1a}$, $Q_{1b}$ functions as a conventional differential input stage having input signal I at terminals $V_{ia}$ and $V_{ib}$ connectd to the respective bases of the transistors with the respective collectors being connected through a series of resistors $R_{1a}$, $R_2$, $R_{1b}$. The transistor pair $Q_1$ is preferably a dual monolithic device or portion of an integrated circuit IC device having a low an input impedance as possible and not producing excessive noise for the application involved. In the case of a bi-polar device, the higher the collector current, the lower the input resistance. However, certain device geometries produce lower input base resistances for the same collector current. The transistor pair $Q_1$, therefore, and its operating parameters, are selected to optimize about the lowest impedance for the particular application, including noise requirements. The outputs $0_1$ of the input or first stage as represented by $Q_{1a}$, $Q_{1b}$ and associated differential circuitry, are differentially coupled from the collectors, respectively, of transistors $Q_{1a}$, $Q_{1b}$ to the inputs of the secondary stage amplifiers denoted generally as $A_2$, which is preferably an integrated circuit or discreet device differential amplifier having a differential gain. The output $0_2$ of the secondary stage amplifiers $A_2$ drives a load (not shown) or additional stages at the output terminals $V_{oa}$, $V_{ob}$. A resistor network formed by the series-parallel combinations of $R_{9a}$, $R_{10a}$ and $R_{9b}$, $R_{10b}$ are connected to the respective outputs $0_2$ of amplifier $A_2$ and provide differential mode feedback signals $0_3$ at the common connection of resistors $R_9$ and $R_{10}$.

The common connections of resistors $R_{10}$ and $R_{11}$ provide a common mode feedback signal $0_4$ which is connected to the base of transistor $Q_5$. Transistor $Q_5$ applies series type common mode feedback $CM_1$ to the transistor input pair $Q_{1a}$, $Q_{1b}$ through the common connection of the emitters thereof via the collector of transistor $Q_5$. The differential mode feedback signals $O_3$ taken from the junction connections of resistors $R_9$ and $R_{10}$ are coupled to a differentially connected active feedback amplifier comprising transistor pair $Q_{2a}$, $Q_{2b}$ and resistors $R_{4a}$, $R_{4b}$ and $R_5$, and a current sink comprising transistor $Q_6$, $R_7$ and diode $CR_3$. The current sink eliminates the common mode output signal from the drains D of transistors $Q_2$ and thus only a current $0_5$ with a differential component is coupled down through the drains of transistors $Q_2$. This current $0_5$, which is supplied by the dual current sources $I_{1a}$, $I_{1b}$, is in shunt with input terminals $V_{ia}$, $V_{ib}$ and when the loop gain is high in the feedback loop, the input impedance of the amplifier system is greatly reduced. Any input common mode signal that appears at the input terminals $V_{ia}$, $V_{ib}$ also appears at the emitters of transistor $Q_1$ and is applied to the input of a differential amplifier $A_1$ which amplifies the input signal and applies the output $CM_2$ to the current sink at $Q_6$. The resultant effect is that the collector current of transistor $Q_6$ is altered which consequently changes the common mode current through the collector $Q_2$ that largely cancels out the common mode signal at the input terminals $V_{ia}$, $V_{ib}$. A reference signal voltage VR generated by the combination of diode $CR_1$ and resistor $R_8$ is applied to the other input terminal of amplifier $A_1$ so that the common mode feedback signal $CM_1$ is compared to a reference signal that is just one diode drop below zero voltage level. Since this level value is equal to the base-emitter drop across transistors $Q_1$, the input signals will be maintained just a diode drop above or at zero volts. Thus, the voltage reference circuit $CR_1$, $R_8$ and the amplifier $A_1$ also serve as a regulator to keep the input at zero volts. The common mode series feedback signal $CM_1$ present at the commonly connected emitters of transistor $Q_1$ will maintain a high impedance at that point and thus tend to prevent any common mode current from inducing common mode signal gain at the collector outputs of transistors $Q_1$. Since the amount of gain in the differential mode feedback loop determines the input impedance, the greater the open loop gain, the lower the impedance that can be achieved. It is to be noted that the higher the gain, the more likely the amplifier will become unstable. However, reduced bandwidth can be traded for greater stability if requirements will allow. Because the input impedance is so low, the input capacitance of the amplifier is effectively shorted out resulting in higher bandwidths than available with conventional voltage mode amplifiers. Using discrete components in the front end of the amplifier, for example, results can be achieved having bandwidths of DC to 3 MHz. Input impedance of less than 1 ohm can also be achieved at reasonably high bandwidths. Because of the current sources $I_{1a}$, $I_{1b}$ and the current sink transistors $Q_{2a}$, $Q_{2b}$ shunting the input pair transistors $Q_{1a}$, $Q_{1b}$, no external biasing is required for the amplifier allowing the source to be completely isolated from ground and, except for stray capacitances or high leakage resistances, the current sources and sinks thus effectively self bias the amplifier system. Resistor $R_2$ is variable and is used to balance the input stage with the remaining components of the amplifier. Resistor $R_2$ is adjusted with the input terminals $V_{ia}$ and $V_{ib}$ shorted. Resistor $R_5$ is also variable and is used to balance the differential feedback current sources and any input sources imbalances. The adjustment of resistor $R_5$ is extremely useful in the case of photodiodes, photovoltaic infrared detectors, and other transducers having an inherent DC offset. Adjustment of resistor $R_5$ will allow the offset to be cancelled out or back biased by the current sources in the amplifier without any external bias supply and the noise and pick up that would accompany it. Resistor $R_{11}$, in conjunction with the parallel combination of $R_{10a}$ and $R_{10b}$, and the parallel combination of $R_{9a}$ and $R_{9b}$ form the voltage divider for the common mode feedback $0_4$ applied to the base of $Q_5$. The diode $CR_2$ is used to compensate the emitter-base diode $Q_5$ for temperature variations.

Figure 2:
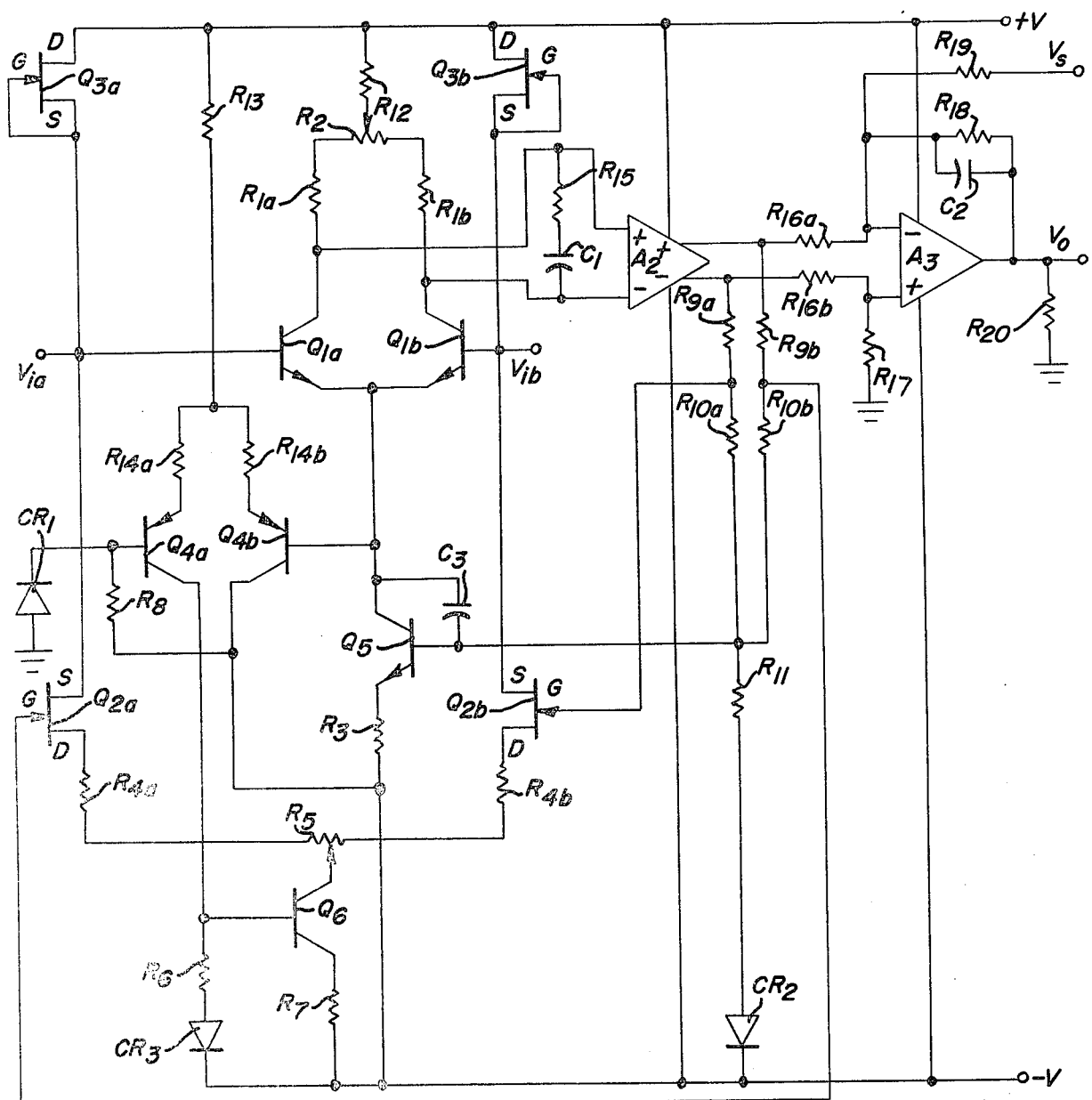
FIG. 2 illustrates a more complete diagram of the differential amplifier circuit shown in FIG. 1 and having a single ended output stage.

Referring now to FIG. 2, there is shown a more detailed circuit diagram of the amplifier circuit shown in FIG. 1 and additionally incorporates a signal ended output stage $A_3$ having an output terminal $V_o$. In this circuit, current sources $I_1$, as shown in FIG. 1, has been expanded to now comprise a duel field effect transistor (FET) $Q_{3a}$, $Q_{3b}$ which is connected as a constant current source pair with the respective gates (G) commonly connected to the respective sources (SZ). Additionally, amplifier $A_1$, noted in FIG. 1, has been expanded into discrete components comprising transistors $Q_{4a}$, $Q_{4b}$ and resistors $R_{13}$ and $R_{14a}$, $R_{14b}$. Resistor $R_{13}$ is commonly connected at one end to $+V$, and at the other end is commonly connected to respective one ends of resistors $R_{14a}$, $R_{14b}$ which are connected at their respective other ends to the collectors of transistor pair $Q_{4a}$, $Q_{4b}$. Capacitor $C_1$ is connected in series with resistor $R_{15}$, the series combination being connected across the input to amplifier $A_2$ to serve as an amplifier compensation network to stabilize the differential feedback portion of the amplifier and to control the bandpass thereof. Amplifier $A_3$ is connected to receive the outputs $0_2$ from amplifier $A_2$ via input resistors $R_{16a}$, $R_{16b}$ and provides an additional amplifier stage to provide additional gain to the differential amplifier system of the present invention and to convert the formerly configured dual output arrangement shown in FIG. 1 to a single ended output signal available at output terminal $V_o$ to drive a load (not shown) between the output terminal $V_o$ and ground. Alternatively, the output amplifier $A_3$ may be a differential stage whereinit is required or desirable to isolate a load from ground. A capacitor $C_3$ is connected between the base and collector of transistor $Q_5$ and serves to stabilize the common mode feedback loop. A unique feature of the amplifier of the present invention is the provision of an input terminal $V_s$ which is connected via a resistor $R_{19}$ to one input of amplifier $A_3$ and which functions to allow an external slewing signal to be applied to set or reset the level or DC operating point of the amplifier $A_3$ so that the output signal can be set externally (and without adjustment of $R_5$) to any level for any input signal. The slewing signal produces a slewing current that is summed at the junction of resistor $R_{16a}$ and the input of amplifier $A_3$ with the input current to produce a shift in the output potential at terminal $V_o$. It should be noted that the slewing signal will change the level of the output signal without effecting the gain of the amplifier. This slewing signal can be used to keep the output signal within the dynamic range of the amplifier. Resistor $R_{18}$ and capacitor $C_2$ are connected in parallel combination between the input and output of amplifier $A_3$ to provide proper feedback and equalization. Resistor $R_{20}$ is the internal load resistor.

Figure 3:
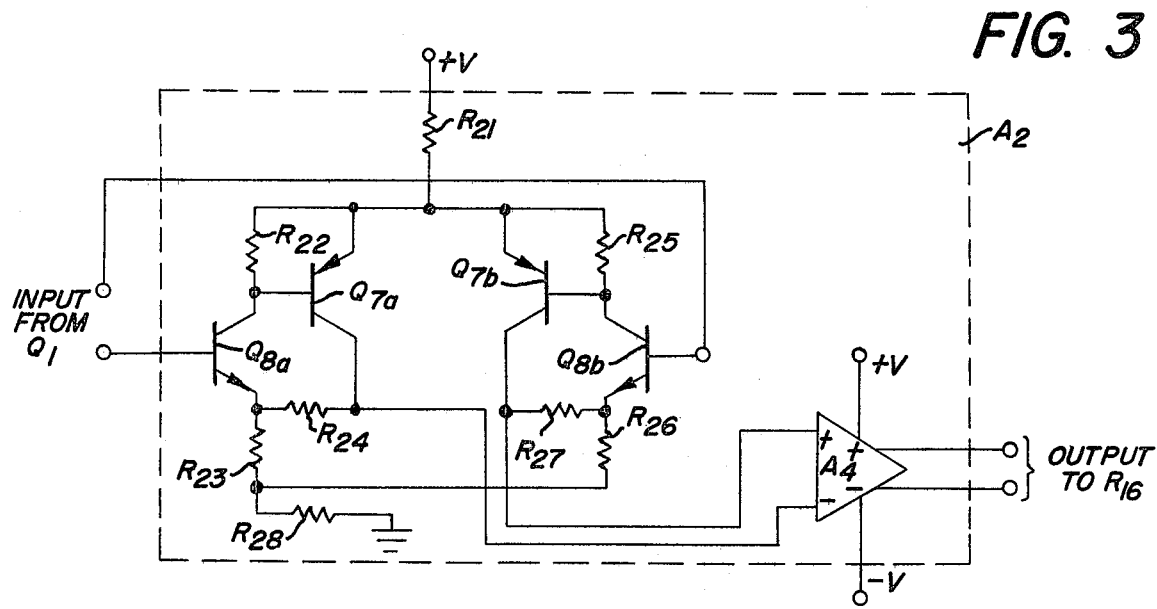
FIG. 3 is a circuit diagram of the output stage of the invention shown in FIG. 1.

Referring now to FIG. 3, there is shown a circuit diagram of the amplifier $A_2$ formerly illustrated in FIGS. 1 and 2. Amplifier $A_2$ comprises a differentially connected input transistor pair $Q_{8a}$, $Q_{8b}$ having the respective bases formed to be connected to the outputs $0_1$ from transistor $Q_1$ and resistors $R_{22}$, $R_{23}$, $R_{25}$ and $R_{26}$. The collectors of the transistors $Q_8$ are respectively connected to the bases of a second transistor pair $Q_{7a}$, $Q_{7b}$ whose emitters are connected in common to a supply voltage through a resistor $R_{21}$ and whose collectors provide output signals which are connected to the input of an amplifier $A_4$. The outputs of amplifier $A_4$ are formed to be connected to the inputs of amplifier $A_3$ via resistors $R_{16}$ as shown in FIG. 2. With such a configuration, this amplifier stage will allow the open loop gain of the differential amplifiers system to be increased which will accordingly allow a lower differential input impedance and higher bandwidths. $Q_8$ and $Q_7$ form c omplimentary compound differential amplifier with resistors $R_{23}$, $R_{24}$ and $R_{27}$, $R_{26}$ forming the differential mode feedback and resistor pairs $R_{23}$, $R_{24}$ and $R_{27}$, $R_{26}$, in conjunction with $R_{28}$ and $R_{21}$, forming the common mode feedback.

Figure 4:
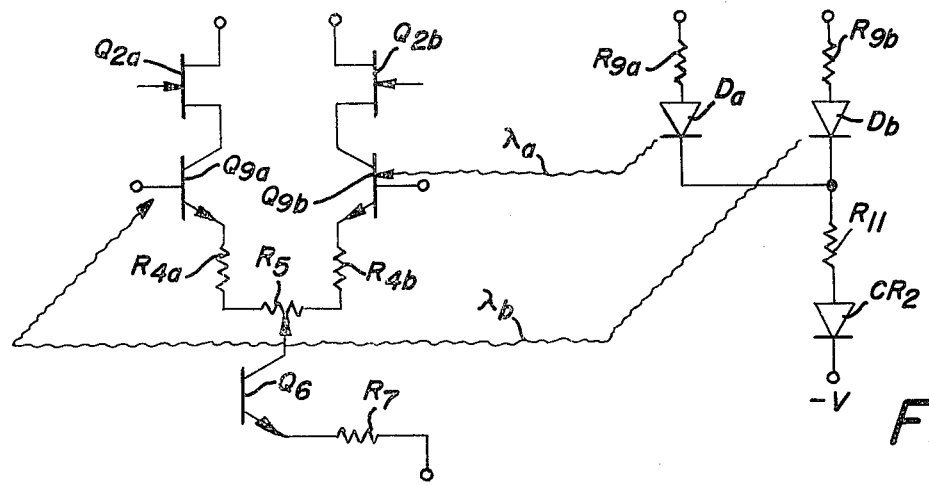
FIG. 4 is a circuit diagram of optically coupled feedback circuitry usable within the differential amplifier of the present invention.

Referring now to FIG. 4, there is shown a circuit diagram of a portion of a differential mode feedback system of the present invention utilizing optical coupling and adaptable to the circuit diagrams shown in FIGS. 1 and 2. In the circuit of this figure, differential mode feedback is accomplished optically by connecting respective one ends of feedback network resistors $R_{9a}$, $R_{9b}$ to the anodes of a pair of light emitting diodes $D_a$, $D_b$ whose cathodes are connected in common with one end of network resistor $R_{11}$, the other end of which is biased with respect to a supply voltage $-V$ via the diode $CR_2$. The lightemitting diodes $D_a$, $D_b$ generate light emissions denoted respectively as $\lambda_a$, $\lambda_b$ wich are optically transmitted to a pair of phototransistors $Q_{9a}$, $Q_{9b}$ respectively connected in series between the drains of FET $Q_2$ and one end of resistors $R_{4a}$, $R_{4b}$. The optical coupling may be direct as in, for an example, an optical coupler or can be extended over a distance by means of a fiber optic link. The latter configuration will produce excellent isolation and increase the frequency stability of the amplifying system by reducing stray capacitive coupling. Other configurations utilizing optical coupling could combine transistors $Q_2$ and $Q_9$ in one photoFET pair. Unfortunately, such photoFET devices do not presently exist on the commerical market as a single component but could be obtained by special development.

Typical values for the resistances, capacitances as well as component identification numbers of active devices are noted hereinbelow in Table I.

TABLE I

| | | | |
|---|---|---|---|
| $R_1$ | 3900 Ω | $R_{23}$ | 51 Ω |
| $R_2$ | 5000 Ω | $R_{24}$ | 270 Ω |
| $R_3$ | 22000 Ω | $R_{25}$ | 10000 Ω |
| $R_4$ | 500 Ω | $R_{26}$ | 51 Ω |
| $R_5$ | 500 Ω | $R_{27}$ | 270 Ω |
| $R_6$ | 20000 Ω | $R_{28}$ | 2700 Ω |
| $R_7$ | 510 Ω | $C_1$ | 47 pf |
| $R_8$ | 39000 Ω | $C_2$ | 10 pf |
| $R_9$ | 10000 Ω | $C_3$ | 470 pf |
| $R_{10}$ | 10 Ω | $CR_1$ | 1N4446 |
| $R_{11}$ | 2700 Ω | $CR_2$ | 1N4446 |
| $R_{12}$ | 30000 Ω | $CR_3$ | 1N4446 |
| $R_{13}$ | 75000 Ω | $Q_1$ | MD2219 |
| $R_{14}$ | 1000 Ω | $Q_2$ | 2N3954 |
| $R_{15}$ | 1000 Ω | $Q_3$ | TD5909 |
| $R_{16}$ | 1000 Ω | $Q_4$ | MD7003 |
| $R_{17}$ | 30000 Ω | $Q_5$ | 2N2222A |
| $R_{18}$ | 30000 Ω | $Q_6$ | 2N2222A |

TABLE I-continued

| | | | |
|---|---|---|---|
| $R_{19}$ | 2000 Ω | $Q_7$ | MD7003A |
| $R_{20}$ | 100 Ω | $Q_8$ | MD2219 |
| $R_{21}$ | 3300 Ω | $A_3$ | LM 318 H |
| $R_{22}$ | 10000 Ω | $A_4$ | μA 733 |

Thus it may be seen that there has been provided a novel self biasing low input impedance differential amplifier which exhibits high stability and common mode rejection.

Obviously, many modifications and variations of the invention are possible in light of the above teachings. Alternative components such as bipolar transistors can be used to replace transistors $Q_2$ and $Q_3$ where the noise requirements are not unduly severe. The operational role of $Q_2$ and $Q_3$ may be inverted with transistor $Q_3$ having the applied feedback and transistor $Q_2$ acting as the fixed current sink. A higher gain amplifier (such as an integrated operational amplifier) may be substituted for amplifier $A_1$ if higher open loop gain is desired. It is therefore to be understood that within the scope of the appended claims, the invention may be practiced otherwise than as specifically described.

What is claimed is:

1. A differential amplifier system comprising, in combination:

input amplifier means adapted to receive an input signal having common mode and differential mode components and connected to receive a first common mode feedback signal and differential mode feedback signal, and for producing a first output signal;

output amplifier means connected to receive said first output signal for producing a second output signal to a load, a third output signal to a first active feedback means, and a fourth output signal to a second active feedback means, said second output signal being an amplified replica of said first output signal, said third and fourth output signals being the differential and common mode components, respectively, of said second output signal;

first active feedback means connected to receive said third output signal and a second common mode feedback signal for providing the differential mode feedback signal to said input amplifier means for controlling the impedance thereof;

second active feedback means including a transistor having a base connected to receive said fourth output signal and a collector for providing said first common mode feedback signal to said input amplifier means for controlling the impedance thereof; and third active feedback means connected to receive said first common mode feedback signal and a reference voltage level for providing said second common mode feedback signal to said first feedback means; whereby the common mode component of said input signal is canceled and the input signal is self-biased to a predetermined voltage level.

2. A differential amplifier system according to claim 1 wherein said third active feedback means is a differential amplifier having a first input connected to receive said first common mode feedback signal and a second input connected to receive the reference voltage level for comparing said first input signal with said reference level and for providing the second common mode feedback signal to said first feedback means.

3. A differential amplifier according to claim 2 wherein said first active feedback means further comprises:
   a pair of differentially connected field effect transistors, each of said devices having gate, source and drain terminals, each of said source terminals being respectively connected in common with said input signal, each of said gate terminals being respectively and connected to receive said third output signal, and said drain terminals operatively connected in common to produce a fifth output signal; and
   a current sink including a transistor having a base connected to receive said second common mode feedback signal, an emitter connected to receive said fifth output signal and a voltage source for eliminating the common mode component of said fifth output signal.

4. A differential amplifier according to claim 1 wherein said input amplifier means has differential inputs and differential outputs.

5. A differential amplifer according to claim 1 wherein said output amplifier means has differential inputs and differential outputs.

6. A differential amplifier according to claim 1 wherein said output amplifier means further comprises:
   a first amplifier connected to receive said first output signal and for producing an intermediate signal; and
   a second amplifier connected to receive said intermediate signal for producing the second output signal.

7. A differential amplifier according to claim 6 wherein said second amplifier has differential inputs connected to receive said intermediate output signal and adapted to receive an external slewing signal to modify the output level of said second output signal.

8. A differential amplifier system according to claim 2 wherein said first active feedback means further comprises:
   photoemissive active feedback means connected to receive and optically transmit said third output signal; and
   photodetecting active feedback means optically connected to receive said third output signal for connection of said differential mode signal to said input amplifier means.

9. A differential amplifier system according to claim 8 wherein said photoemissive feedback means further comprises a pair of light emitting diodes having anodes operatively connected to receive said third output signal and cathodes commonly and operatively connected to a voltage source for producing light emissions indicative of the differential mode feedback signal.

10. A differential amplifier system according to claim 9 wherein said photodetecting feedback means further comprises a pair of phototransistors having photojunctions optically connected to receive said photoemissive differential mode feedback signals, emitters operatively connected in common to a voltage source, and collectors operatively connected for supplying the differential mode feedback signals to said input amplifier means.

11. A differential amplifier system comprising in combination:
   input amplifier means adapted to receive an input signal having common mode and differential mode components and connected to receive a first common mode feedback signal, for producing a first output signal;
   output amplifier means connected to receive the first output signal, for supplying a second output signal, which is an amplified replica of the first output signal, to a load, and third and fourth signals which are the differential mode and common mode components, respectively, of the second output signal;
   first active feedback means connected to receive the third and fourth output signals for providing common mode and differential mode feedback signals to the input of said input amplifier means for controlling the impedance thereof; and
   second active feedback means connected to receive the first common mode feedback signal and a reference voltage level for providing a second common mode feedback signal to said first active feedback means;
   whereby the common mode component of said input signal is cancelled and the input signal is self-biased to a predetermined voltage level.

* * * * *